(12) United States Patent
Kou et al.

(10) Patent No.: US 12,112,958 B2
(45) Date of Patent: Oct. 8, 2024

(54) WAFER PROCESSING SYSTEM

(71) Applicant: HIGHLIGHT TECH CORP., Tainan (TW)

(72) Inventors: Chwung-Shan Kou, Tainan (TW); Chien-Cheng Chang, Tainan (TW); Chia-Ou Chang, Tainan (TW)

(73) Assignee: HIGHLIGHT TECH CORP., Tainan (TW)

( * ) Notice: Subject to any disclaimer, the term of this patent is extended or adjusted under 35 U.S.C. 154(b) by 0 days.

(21) Appl. No.: 18/520,647

(22) Filed: Nov. 28, 2023

(65) Prior Publication Data

US 2024/0290634 A1 Aug. 29, 2024

(30) Foreign Application Priority Data

Feb. 24, 2023 (TW) ................. 112107000

(51) Int. Cl.
*H01L 21/304* (2006.01)
*H01L 21/67* (2006.01)
*H01L 21/673* (2006.01)

(52) U.S. Cl.
CPC ........ *H01L 21/67028* (2013.01); *H01L 21/67* (2013.01); *H01L 21/673* (2013.01); *H01L 21/304* (2013.01)

(58) Field of Classification Search
CPC . H01L 21/67028; H01L 21/304; H01L 21/67; H01L 21/673
See application file for complete search history.

(56) References Cited

U.S. PATENT DOCUMENTS

| | | | |
|---|---|---|---|
| 4,711,610 A | * 12/1987 | Riehl | B23Q 11/0035 269/21 |
| 6,235,147 B1 | 5/2001 | Lee et al. | |
| 2008/0032066 A1 | * 2/2008 | Stiblert | G03F 7/704 29/559 |
| 2015/0008632 A1 | * 1/2015 | Gleissner | H01L 21/68721 269/225 |

(Continued)

FOREIGN PATENT DOCUMENTS

| | | | | |
|---|---|---|---|---|
| CN | 106527050 A | * | 3/2017 | |
| CN | 110890301 B | * | 6/2024 | ....... H01L 21/67121 |

(Continued)

OTHER PUBLICATIONS

Machine Translation of CN 110890301 B to Hao. (Year: 2024).*

(Continued)

*Primary Examiner* — Benjamin L Osterhout

(57) ABSTRACT

Disclosed is a wafer processing system comprising a processing tank, a cleaning device and a drying device. The processing tank has a cantilever rotating device and a dynamic balance correction device. The cantilever rotating device has a holding part for holding a wafer of a variety of specification parameters and causing the wafer to rotate along a rotating shaft of the cantilever rotating device. The dynamic balance correction device performs a corresponding dynamic balance correction on the cantilever rotating device, so that the cantilever rotating device is in a dynamic balance state during rotation. A dynamic nozzle unit of the cleaning device ejects a cleaning fluid to clean the rotating wafer. The drying device is used to dry the rotating wafer.

23 Claims, 8 Drawing Sheets

(56) References Cited

U.S. PATENT DOCUMENTS

| | | |
|---|---|---|
| 2015/0030416 A1 | 1/2015 | Sakiya et al. |
| 2020/0107404 A1* | 4/2020 | Morita .................. H05B 3/283 |
| 2022/0130691 A1* | 4/2022 | Tachibana ......... H01L 21/67248 |

FOREIGN PATENT DOCUMENTS

| | | |
|---|---|---|
| KR | 100789542 B1 * | 1/2008 |
| KR | 20220055418 A * | 5/2022 |
| TW | 202004961 A | 1/2020 |
| TW | 202303835 A | 1/2023 |

OTHER PUBLICATIONS

Machine Translation of CN 106527050 A to Wu. (Year: 2017).*
Machine Translation of KR 20220055418 A to Tachibana et al. (Year: 2022).*
Machine Translation of KR 100789542 B1 to Choi et al. (Year: 2008).*

* cited by examiner

WAFER PROCESSING SYSTEM

CROSS-REFERENCE TO RELATED APPLICATION

This application claims priority from Taiwan Patent Application No. 112107000, filed on Feb. 24, 2023, in the Taiwan Intellectual Property Office, the content of which are hereby incorporated by reference in their entirety for all purposes.

BACKGROUND OF THE DISCLOSURE

1. Field of Disclosure

The disclosure relates to a processing system, and more particularly to a wafer processing system.

2. Related Art

The production of semiconductors requires a considerable quantity of processes, and cleaning and drying procedures are often required before completion. However, the existing cleaning procedures are not only slow but also prone to producing waste liquid. For example, in the photolithography process, the photoresist layer must be completely cleaned and removed to ensure the cleanliness of the subsequent processes. However, the current methods mostly use high-temperature sulfuric acid/hydrogen peroxide detergent for removal, the disadvantage is that it produces a large amount of waste acid and is not environmentally friendly. Currently, although there are attempts to use ozone technology to replace existing photoresist removers, they are limited by ozone's solubility, stability, and mass transfer speed, so it is difficult to remove photoresist efficiently. Furthermore, although semiconductor materials, such as wafer, have high hardness, their high brittleness makes them prone to defects or even cracking due to uneven stress or vibration during cleaning or drying procedure. Moreover, as the integration of semiconductors becomes higher and higher, the aspect ratio of the component stack structure is also getting higher and higher, so it is becoming more difficult to achieve the expected effects with the traditional cleaning and drying procedures. It can be seen that there is still much room for improvement in the existing semiconductor processing technologies.

SUMMARY OF THE DISCLOSURE

In view of the above, one object of the disclosure is to provide a wafer processing system to solve the problems of conventional technologies.

In order to achieve the above object, the disclosure provides a wafer processing system at least comprising: at least one processing tank having a cantilever rotating device and a dynamic balance correction device, the cantilever rotating device has a holding part for holding a wafer of a variety of specification parameters and causing the wafer to rotate along a rotating shaft of the cantilever rotating device, wherein the dynamic balance correction device performs a corresponding dynamic balance correction on the cantilever rotating device, so that the cantilever rotating device is in a dynamic balance state during rotation; a cleaning device having at least one dynamic nozzle unit, the dynamic nozzle unit correspondingly adjusts at least one operating parameter according to the specification parameters of the wafer, and ejects a cleaning fluid to the wafer to perform a cleaning procedure when the cantilever rotating device rotates; and a drying device used to perform a drying procedure on the wafer that has been processed by the cleaning procedure when the cantilever rotating device rotates.

Based on the above, the wafer processing system according to the disclosure has one advantage and one technical efficacy or more than one advantage and more than one technical efficacy:

(1) The cantilever rotating device is capable of rotating the wafer at a required speed, and is capable of saving components and making an interior of the processing tank simpler.
(2) The cantilever rotating device rotates the wafer obliquely to increase an efficiency of cleaning and drying the wafer. A tilted interceptor plate helps to discharge the cleaning fluid and prevents the cleaning fluid from accumulating in the processing tank.
(3) The dynamic balance correction device is capable of maintaining the dynamic balance state of the cantilever rotating device when holding the wafer with a variety of specification parameters during rotation.
(4) The dynamic nozzle unit is capable of adjusting operating parameter according to the specification parameters of the wafer during the cleaning procedure, and is capable of saving a usage amount of the cleaning fluid and achieving cleaning effects faster.
(5) An auxiliary gas supplied by an auxiliary gas supply source could be used to assist in cleaning the wafer and could also be used to assist in drying the wafer.
(6) The drying device has a thermal energy supply unit capable of increasing a temperature in the processing tank, and an air extraction unit capable of reducing an air pressure in the processing tank to accelerate drying of the wafer.
(7) An anti-vibration foot made of rigid materials is capable of effectively reducing a vibration value.
(8) The use of vapor ozone stripping (VOS) technology helps to improve an effect of cleaning and removing photoresist, and is capable of significantly reducing any impact on the environment, health and safety.

In order to enable the examiner to have a further understanding and recognition of the technical features of the disclosure, preferred embodiments in conjunction with detailed explanation are provided as follows.

DETAILED DESCRIPTION OF THE DISCLOSURE

Figure 1:
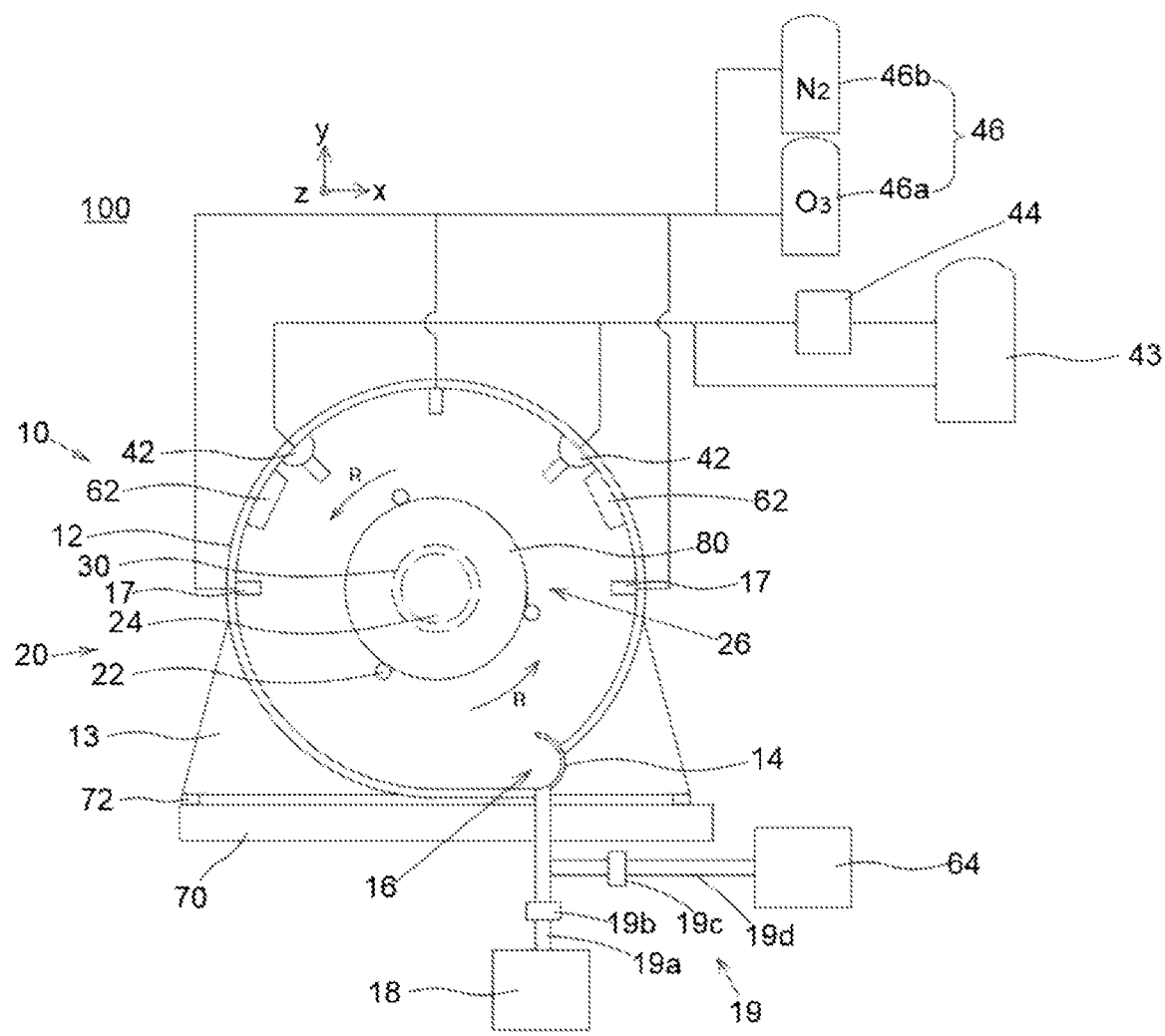
FIG. 1 is a front view of system architecture of a wafer processing system of the disclosure.

In order to understand the technical features, content and advantages of the disclosure and its achievable efficacies, the disclosure is described below in detail in conjunction with the figures, and in the form of embodiments, the figures used herein are only for a purpose of schematically supplementing the specification, and may not be true proportions and precise configurations after implementation of the disclosure; and therefore, relationship between the proportions and configurations of the attached figures should not be interpreted to limit the scope of the claims of the disclosure in actual implementation. In addition, in order to facilitate understanding, the same elements in the following embodiments are indicated by the same referenced numbers. And the size and proportions of the components shown in the drawings are for the purpose of explaining the components and their structures only and are not intending to be limiting.

Unless otherwise noted, all terms used in the whole descriptions and claims shall have their common meaning in the related field in the descriptions disclosed herein and in other special descriptions. Some terms used to describe in the present disclosure will be defined below or in other parts of the descriptions as an extra guidance for those skilled in the art to understand the descriptions of the present disclosure.

The terms such as "first", "second", "third" and "fourth" used in the descriptions are not indicating an order or sequence, and are not intending to limit the scope of the present disclosure. They are used only for differentiation of components or operations described by the same terms.

Moreover, the terms "comprising", "including", "having", and "with" used in the descriptions are all open terms and have the meaning of "comprising but not limited to".

Figure 2:
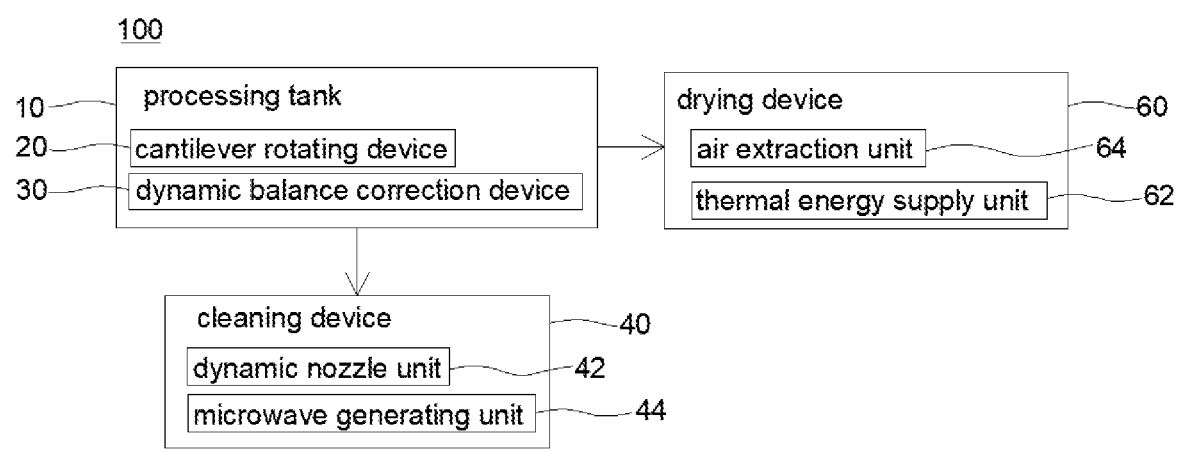
FIG. 2 is an operational block diagram of the wafer processing system of the disclosure.
Figure 3:
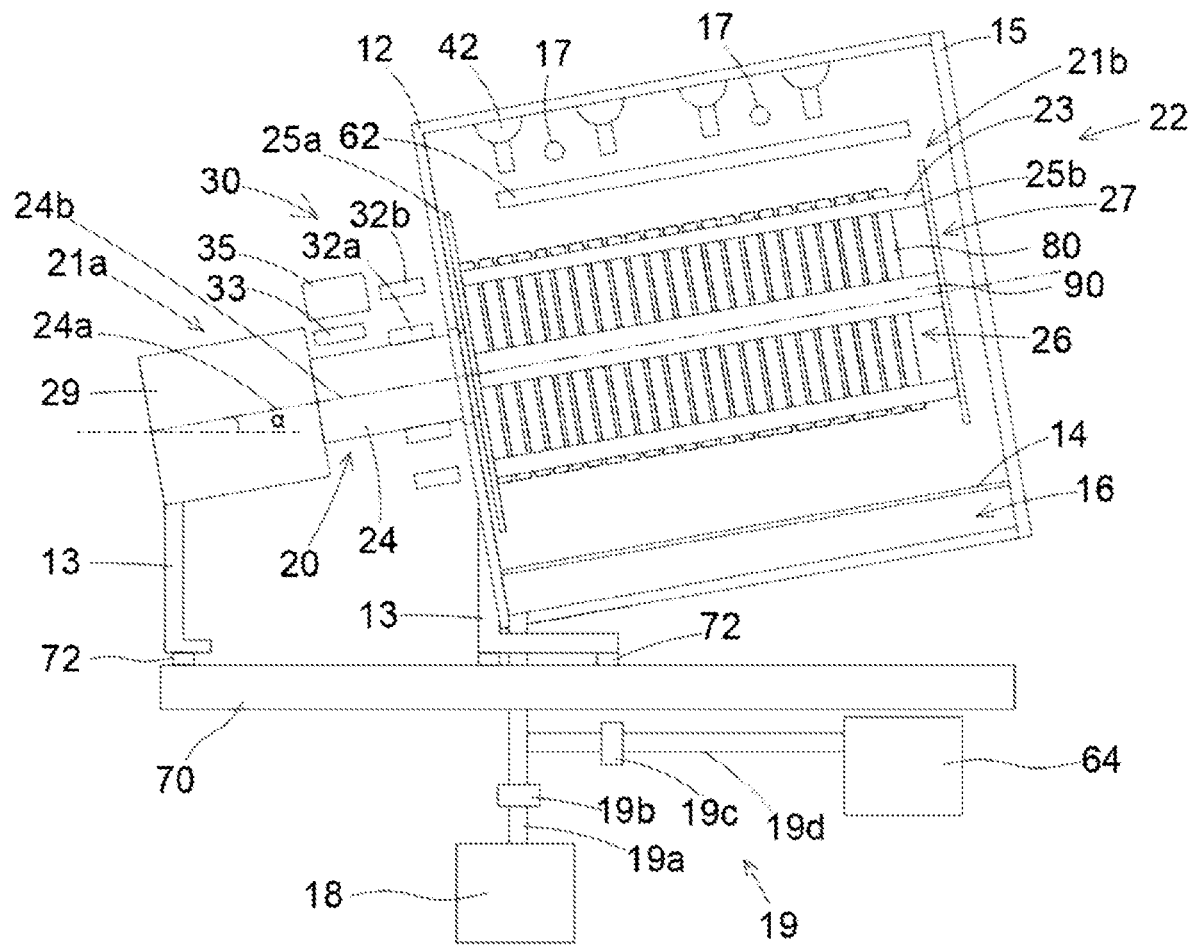
FIG. 3 is a side view of a first implementation mode of the wafer processing system of the disclosure.
Figure 4:
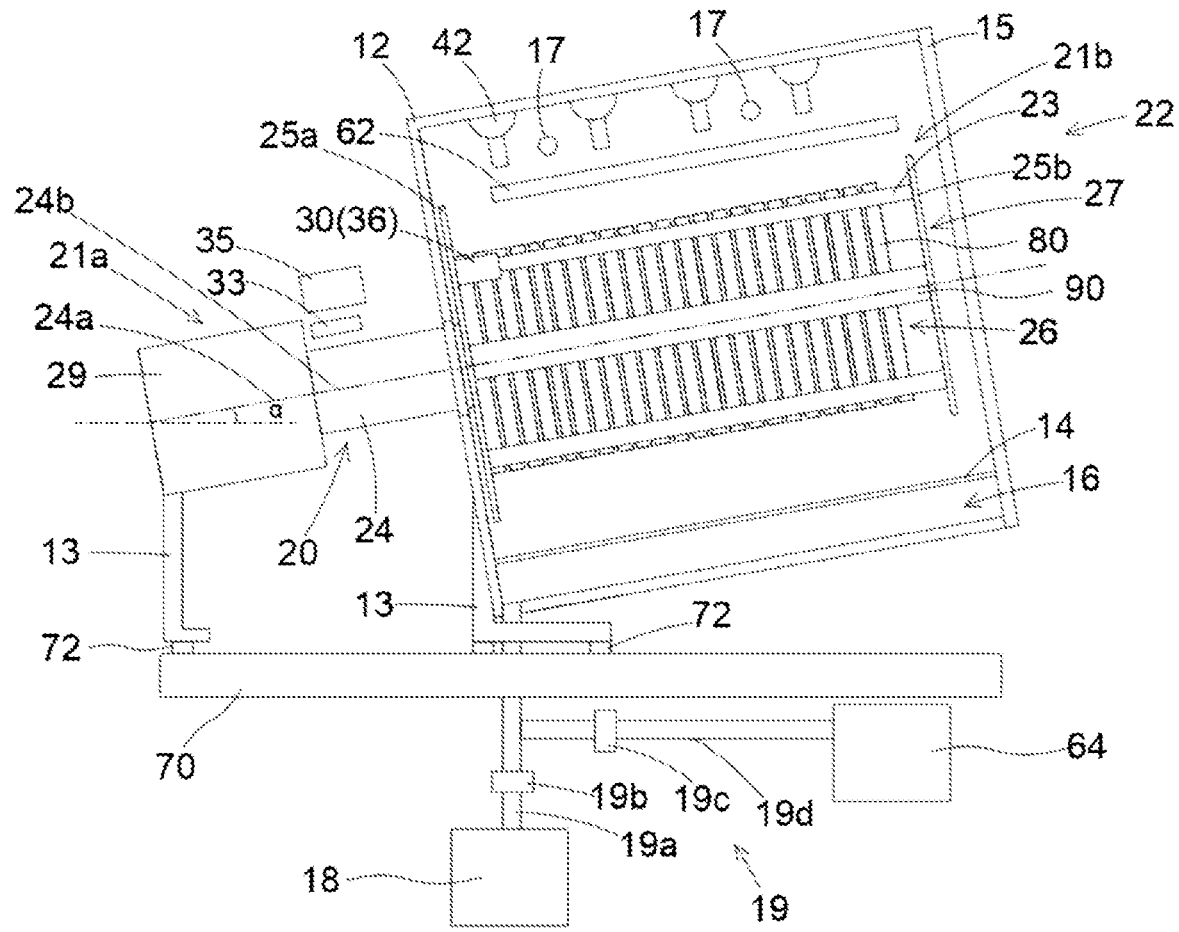
FIG. 4 is a side view of a second implementation mode of the wafer processing system of the disclosure.
Figure 5:
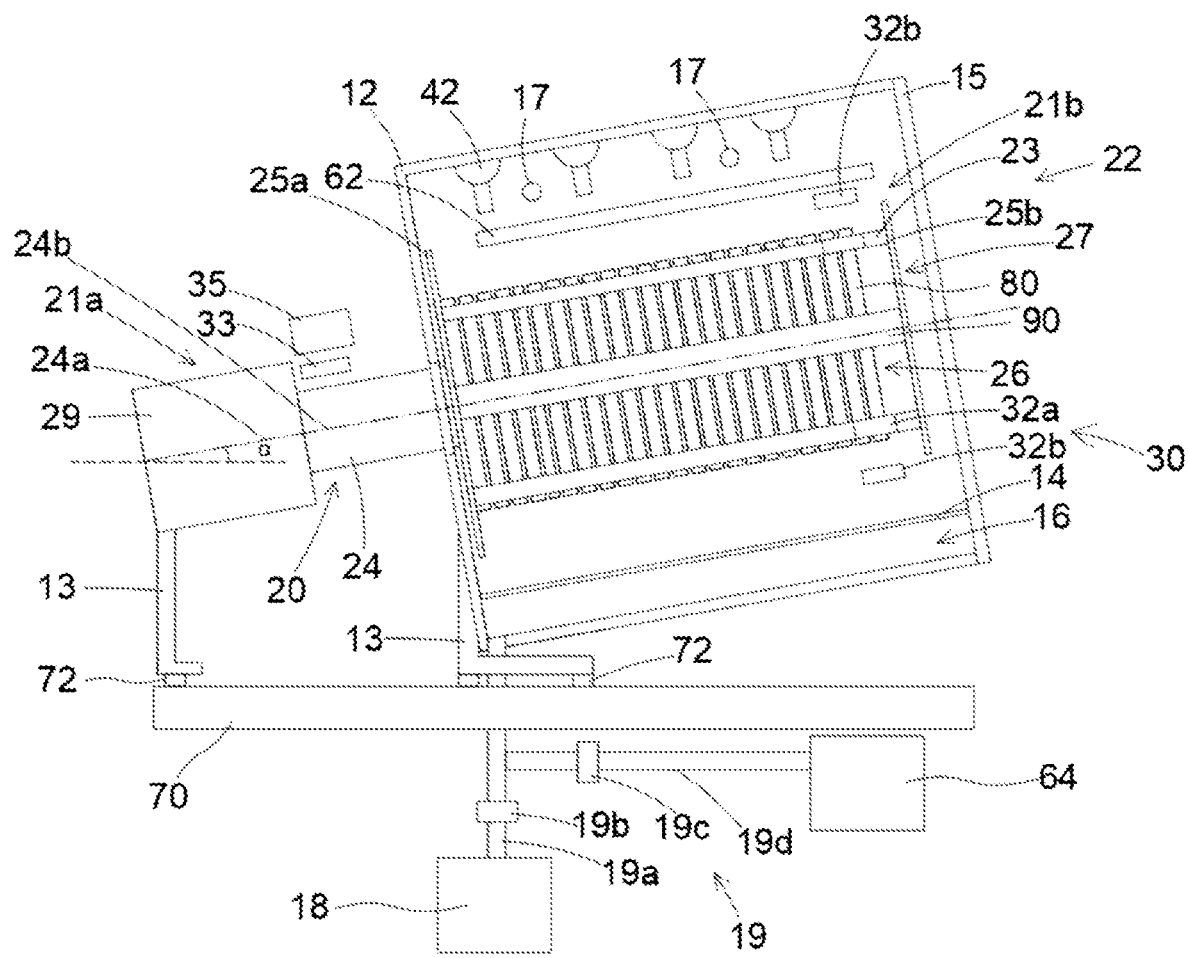
FIG. 5 is a side view of a third implementation mode of the wafer processing system of the disclosure.
Figure 6:
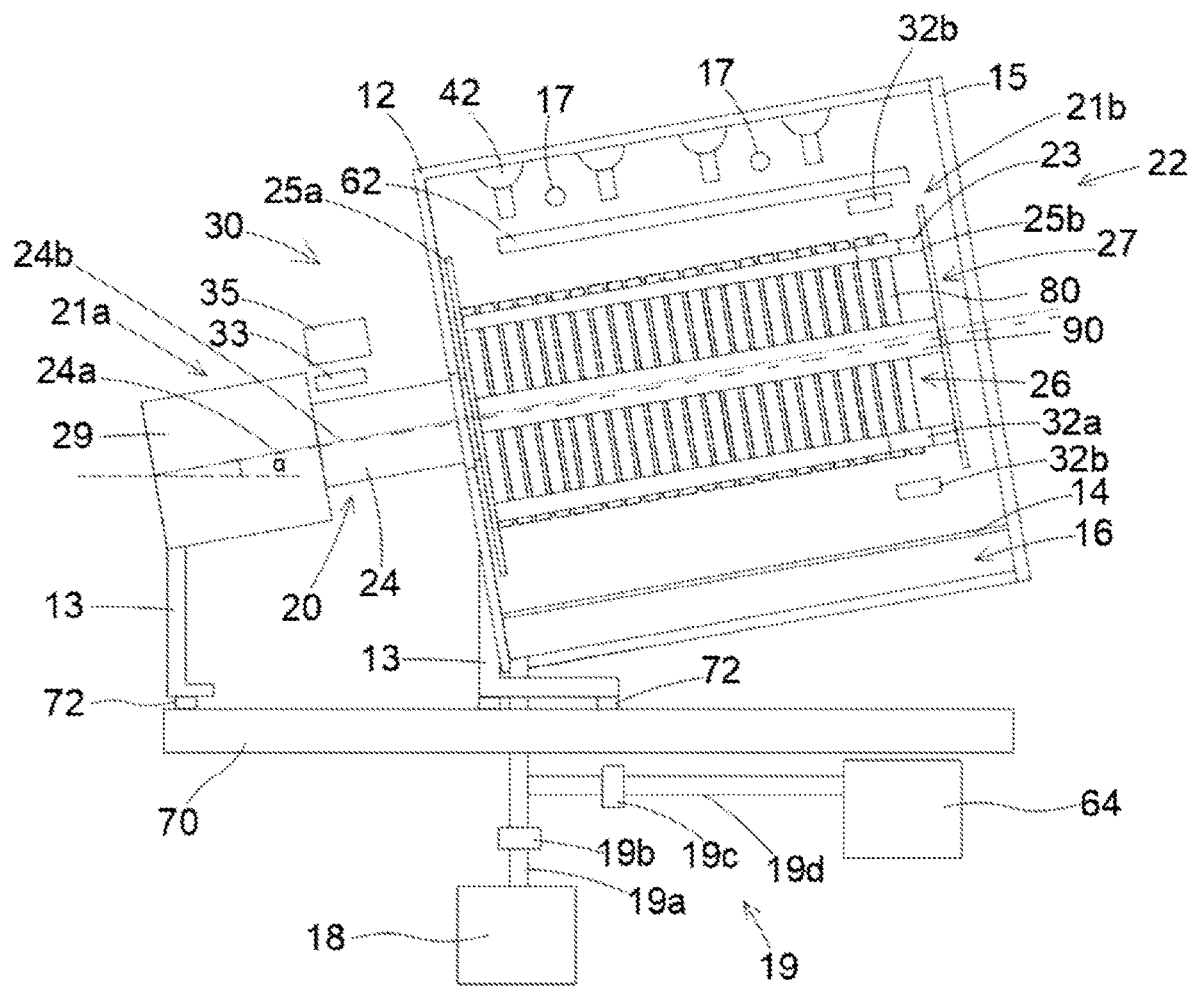
FIG. 6 is a side view of the third implementation mode of the wafer processing system of the disclosure before a dynamic balance correction is performed.
Figure 7:
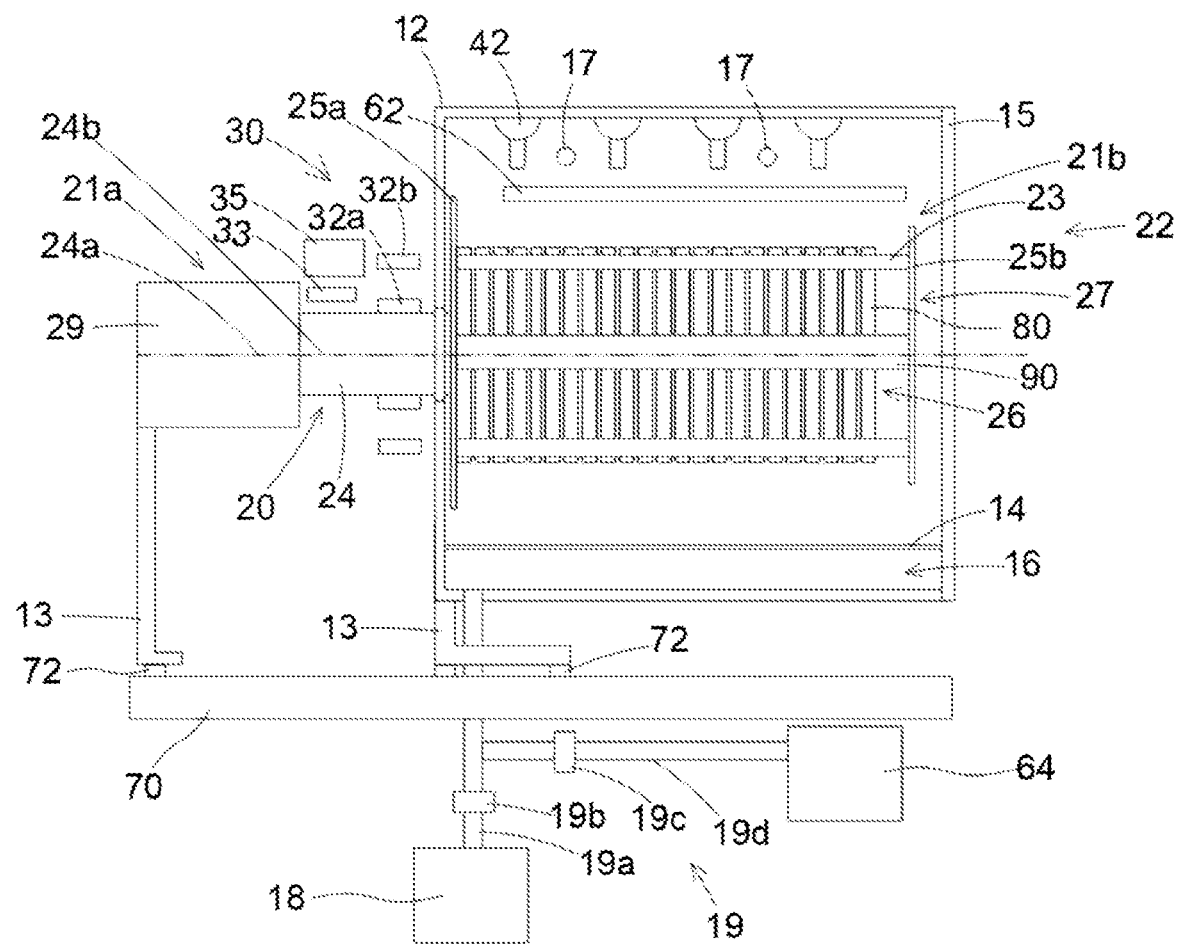
FIG. 7 is a side view of a fourth implementation mode of the wafer processing system of the disclosure.
Figure 8:
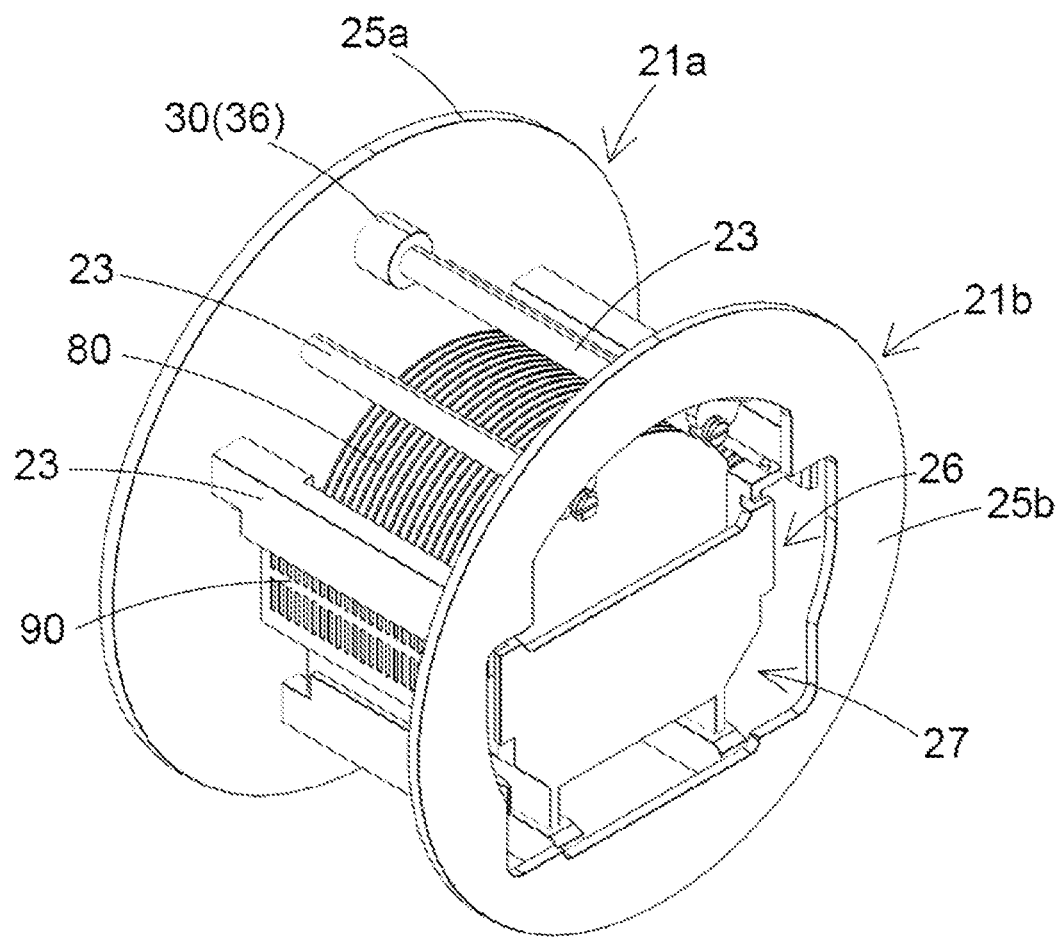
FIG. 8 is a perspective structural view of a holding part of the wafer processing system of the disclosure.

Please refer to FIGS. 1 to 8. FIG. 1 is a front view of system architecture of a wafer processing system of the disclosure. FIG. 2 is an operational block diagram of the wafer processing system of the disclosure. FIG. 3 is a side view of a first implementation mode of the wafer processing system of the disclosure. FIG. 4 is a side view of a second implementation mode of the wafer processing system of the disclosure. FIG. 5 is a side view of a third implementation mode of the wafer processing system of the disclosure. FIG. 6 is a side view of the third implementation mode of the wafer processing system of the disclosure before a dynamic balance correction is performed. FIG. 7 is a side view of a fourth implementation mode of the wafer processing system of the disclosure. FIG. 8 is a perspective structural view of a holding part of the wafer processing system of the disclosure. In order to more clearly display the structural design of the disclosure, FIG. 2 to FIG. 8 only illustrate partial structures of the disclosure.

A wafer processing system 100 of the disclosure comprises at least one processing tank 10, a cleaning device 40 and a drying device 60. The processing tank 10 has a cantilever rotating device 20 and a dynamic balance correction device 30. The cantilever rotating device 20 has a holding part 22 and a rotating shaft 24. The holding part 22 is used to detachably hold a wafer box 90 loaded with a wafer 80 (i.e., one or more wafer(s)) of a variety of specification parameters (as shown in FIGS. 3 to 8), and is capable of even directly detachably holding the wafer 80 of a variety of specification parameters (shown in FIG. 1), for example. The specification parameters of the wafer 80 are, for example, selected from a group consisting of quantity, weight, position, and size. The rotating shaft 24 is used to drive the holding part 22 to rotate, so that the wafer 80 uses an axis line of the rotating shaft 24 as a rotating axis to rotate along the rotating shaft 24, for example, in a clockwise direction or a counterclockwise direction R (as shown in FIG. 1). The rotating shaft 24 of the disclosure could have a variety of rotation speeds according to actual requirements. A rotation speed ranges, for example, but is not limited to, from greater than 0 rpm to as high as about 12,000 rpm. The cleaning device 40 at least comprises a fluid supply tank 43 and at least one dynamic nozzle unit 42. The fluid supply tank 43 is used to store a cleaning fluid. The dynamic nozzle unit 42 is communicated to the fluid supply tank 43 and is used to eject the cleaning fluid on the wafer 80 to perform a cleaning procedure when the cantilever rotating device 20 rotates the wafer 80. The drying device 60 is used to perform a drying procedure on the wafer 80 that has been processed by the above cleaning procedure when the cantilever rotating device 20 rotates the wafer 80.

Since after the cantilever rotating device 20 holds the wafers 80 of different quantities and weights, a position of an overall center line of mass that was originally in an overlapping state will change in varying degrees, thus causing a variety of structures (such as the holding part 22, the rotating shaft 24 or the wafers 80) to be subjected to different degrees of centrifugal force at different positions in a same distance from an axis line 24a of the rotating shaft 24. Therefore, the dynamic balance correction device 30 of the disclosure performs a corresponding dynamic balance correction on the cantilever rotating device 20 based on, for example, one or more than one specification parameter(s) of the wafer 80, operating parameter of the dynamic nozzle unit 42, a rotation speed of the rotating shaft 24 and/or a vibration state, so that the cantilever rotating device 20 is still capable of maintaining a dynamic balance state during rotation while holding the wafers 80 of different quantities and weights.

For example, the processing tank 10 has a shield 12 surrounding an outer side of the cantilever rotating device 20 so that an interior of the processing tank 10 forms a sealed or airtight chamber. Wherein the shield 12 has, for example, a cover 15 to optionally open or close the chamber of the processing tank 10. When the cantilever rotating device 20 rotates, the processing tank 10 remains stationary. The cleaning device 40 and the drying device 60 are, for example, disposed on the shield 12 or located in a space between the wafer 80 and the shield 12 to perform the cleaning procedure and the drying procedure on the wafer 80 respectively. The shield 12 has, for example, an interceptor plate 14. The interceptor plate 14 is, for example, located on an inner side of the shield 12 and extends upward from a bottom of the shield 12. An interceptor opening 16 of the interceptor plate 14 faces a tangential direction of the wafer 80 during rotation, thereby the cleaning fluid (such as waste liquid and/or waste gas and other mixed fluids) that has completed the cleaning procedure for the rotating wafer 80 could be intercepted. If a cross-section of the interceptor plate 14 is a baffle with an outer shape formed by an arc-shaped or a semi-circular top side, splashing of the cleaning fluid caused by the cleaning fluid being intercepted could be reduced, and the wafer 80 being cleaned could be prevented from contaminating by the cleaning fluid that has performed the cleaning procedure. Therefore, the disclosure is capable of shortening a time required for the overall cleaning procedure by providing the interceptor plate 14 on the shield 12. Moreover, if the interceptor plate 14 of the shield 12 is inclined (a height decreases from one side of the shield 12 to another side), that is, an extending direction is not parallel to a horizontal plane, a flow diversion effect could also be provided, so that the cleaning fluid could be quickly and completely discharged to outside of the processing tank 10 by gravity. Wherein the disclosure further comprises a drainage system 18, such as a water pump. The drainage system 18 is communicated to the processing tank 10 through an output pipe fitting 19, such as an output pipe 19a and a control valve 19b, and is located on another side of the interceptor plate 14 with a lower height.

The processing tank 10 of the disclosure could also be optionally disposed on a platform 70 through at least one anti-vibration foot 72. The shield 12 could, for example, have a base 13, and for example, comprise the at least one anti-vibration foot 72 located between the base 13 of the shield 12 and the platform. 70, which helps to make at least one vibration value of the processing tank 10 further smaller than a preset value, and the preset value is about 10 mm/s. A quantity of the anti-vibration foot 72 is not limited, it is, for example, any value greater than 1, such as 2, 4, 6 or 8, and is made of, for example, rigid materials (such as stainless steel and other metals). The rigid materials have a rigidity coefficient (k), for example, approximately greater than 100. The disclosure uses the anti-vibration foot 72 made of rigid materials to change a resonant frequency in order to reduce a vibration value. Taking the cantilever rotating device 20 respectively holding the wafer box 90 loaded with 1 to 22 pieces of the wafer 80 made of GaAs material and using the six anti-vibration feet 72 as an example, when a rotation speed increases from 200 rpm to 1300 rpm, conventionally using metal anti-vibration feet covered with rubber material (rigidity coefficient being 100), vibration values in the three directions obtained (such as the x-axis, y-axis, z-axis directions, that is, two perpendicular radial directions and one axial direction perpendicular to the radial direction) will increase by approximately 6 to 25 times from approximately 2 mm/s originally. However, vibration values in the three directions obtained from the anti-vibration feet 72 made of rigid materials (rigidity coefficient being 412) adopted by the disclosure are all lower than 6 mm/s. Even when a quantity of the wafer 80 is 22, vibration values in the three directions could be maintained approximately between 0.3 mm/s~1.96 mm/s. It is obvious that the anti-vibration feet 72 made of rigid materials adopted by the disclosure indeed have technical efficacies that cannot be achieved by the conventional technologies. In addition, a quantity of the processing tank 10 of the disclosure could be one or more than one, and a material could be, for example, stainless steel or other acid and alkali resistant materials, but is not limited thereto. Taking the processing tanks 10 (for example, two) located on the same platform 70 as an example, the two processing tanks 10 could even achieve an effect of reducing a vibration value by abutting against each other. The platform 70 applicable to the disclosure is not particularly limited, the platform 70 could be, for example, a base, a frame, a workbench, or even the ground, or any other object on which the processing tank 10 could be placed.

The rotating shaft 24 of the cantilever rotating device 20 of the disclosure rotates in a single-arm suspended mode, and is, for example, rotated obliquely at an angle that is not parallel to a horizontal plane. Especially for the wafer 80 of a component stack structure with a high aspect ratio that is traditionally difficult to clean and prone to residual phenomena, the disclosure is capable of achieving better cleaning effects and improving residual phenomena of the cleaning fluid. In one embodiment, the above-mentioned angle is about 10 degrees, that is, an included angle α between the axis line 24a of the rotating shaft 24 and a horizontal plane is 10 degrees. However, the disclosure is not limited thereto. A range of the above-mentioned angle could also be, for example, between about 0 degree and about 90 degrees. Furthermore, the rotating shaft 24 of the cantilever rotating device 20 of the disclosure could also rotate parallel to (as shown in FIG. 7) or perpendicular to a horizontal plane according to usage requirements. One feature of the disclosure is that the dynamic balance correction device 30 could be used to perform the dynamic balance correction on the cantilever rotating device 20 according to the specification parameters of the wafer 80, a flow rate of the cleaning fluid, a rotation speed of the rotating shaft 24 and/or a vibration state (such as vibration value in each direction), that is, correcting a degree of overlap between a center line of mass 24b of the cantilever rotating device 20 holding the wafer 80 and the axis line 24a of the rotating shaft 24 (as shown in FIGS. 5 and 6), that is, making the cantilever rotating device 20 to be in a dynamic balance state during rotation. When a degree of overlap between the center line of mass 24b and the axis line 24a is higher, centrifugal forces at different positions on a circumference of the rotating shaft 24 will be closer. Therefore, even if the holding part 22 holds the wafer 80 with a variety of specification parameters, the disclosure is capable of using the dynamic balance correction device 30 to make the center line of mass 24b coincide with the axis line 24a of the rotating shaft 24, that is, a same structure (such as the holding part 22, the rotating shaft 24 or the wafer 80) could receive a same degree of centrifugal force at different positions at a same distance from the axis line 24a of the rotating shaft 24. Therefore, the disclosure is further capable of reducing defects or cracks caused by uneven stress on the wafer 80 during rotation.

The rotating shaft 24 of the disclosure could be, for example, a ball bearing or a magnetic bearing, thereby the rotating shaft 24 could be driven to rotate by contact mode (such as a motor) or driven to magnetically suspend and rotate by non-contact mode (such as electromagnetic force) through a driving component 29 respectively. Taking the rotating shaft 24 as a magnetic bearing driven by electromagnetic force as an example, the rotating shaft 24 could be an active magnetic bearing, a passive magnetic bearing or a hybrid (composed of an active magnetic bearing and a passive magnetic bearing) magnetic bearing.

The cantilever rotating device 20 of the disclosure is a single-arm rotating mechanism, that is, one side is a supporting end 21a, and another side is a free end 21b. In detail, the cantilever rotating device 20 comprises the rotating shaft 24 and the holding part 22 connected to each other, wherein one end of the rotating shaft 24 is located at the supporting end 21a, one end of the holding part 22 is connected to another end of the rotating shaft 24, and another end of the holding part 22 is located at the free end 21b. The holding part 22 is configured to detachably hold the wafer 80 of a variety of specification parameters, or to detachably hold the wafer box 90 loaded with the wafer 80 of a variety of specification parameters. The holding part 22 has, for example, a plurality of wafer holders 23 and two connecting plates 25a, 25b. The two connecting plates 25a, 25b are respectively located at two ends of the wafer holder 23 to form a frame with positioning grooves 26. Wherein the connecting plate 25b located at the free end 21b has an opening 27 communicated to the positioning groove 26. Therefore, the wafer 80 is detachably placed in the positioning groove 26 of the holding part 22 of the cantilever rotating device 20 through the opening 27 located at the free end 21b. Shape or size of the holding part 22 and the positioning groove 26 thereof is not particularly limited. As long as the wafer 80 or the wafer box 90 carrying the wafer 80 could be hold and loosening or falling off could be prevented, any shape or size could be applicable to the disclosure. For example, the wafer box 90 could be a commercially available wafer box of a variety of sizes, and the wafer 80 could be of a variety of sizes, quantities, weights or materials, such as Si, SiC, SiGe, Ge, GaAs, GaN or InP, etc., and for example, could be component stack structures with a variety of weights processed by any semiconductor process. Shape or size of the positioning groove 26 of the holding part 22 corresponds to the wafer 80 or the wafer box 90 carrying the wafer 80.

The dynamic balance correction device 30 of the processing tank 10 of the disclosure is, for example, provided on the holding part 22, the rotating shaft 24 of the cantilever rotating device 20, or provided on the holding part 22 and the rotating shaft 24, for automatically and/or manually performing the dynamic balance correction on the cantilever rotating device 20 during rotation and/or before rotation, so that the cantilever rotating device 20 is capable of maintaining a dynamic balance state during rotation. A quantity of the dynamic balance correction device 30 is not particularly limited, it could be one or more than one. As long as the dynamic balance correction could be performed, it could be applicable to the disclosure.

For example, the dynamic balance correction device 30 of the processing tank 10 of the disclosure is, for example, an active magnetic bearing or other component that is capable of performing the dynamic balance correction on the cantilever rotating device 20 in a non-contact manner using an over-distance force effect. Taking active magnetic bearing as an example, the dynamic balance correction device 30 comprises, for example, at least one first magnetic element 32a and at least one second magnetic element 32b of magnetic correction ring components. The first magnetic element 32a is circularly disposed on the rotating shaft 24 (shown in FIG. 3) or the holding part 22 (shown in FIGS. 5 and 6) of the cantilever rotating device 20, and the second magnetic element 32b surrounds the cantilever rotating device 20 in a non-contact manner, for example, being disposed on the shield 12 or other positions, an over-distance force effect between the first magnetic element 32a and the second magnetic element 32b is used to perform the dynamic balance correction on the cantilever rotating device 20 in a non-contact manner. The first magnetic element 32a is, for example, a magnetic element such as an iron plate or a magnet, and the second magnetic element 32b is, for example, an electromagnet with adjustable magnetic force, thereby forming a radial magnetic bearing. Wherein the radial magnetic bearing of the disclosure could be divided into three-pole type, four-pole type, eight-pole type, sixteen-pole type or so on according to a structural type. Taking the eight-pole type as an example, eight magnetic poles are divided into four pairs to form four sets of independent magnetic circuits, which control two directions in pairs. The dynamic balance correction device 30 could also optionally comprise a position sensor 33 and a controller 35. The position sensor 33 is used to sense a radial position of the cantilever rotating device 20 in real time, and the controller 35 generates a corresponding control signal based on a sensing result of the position sensor 33 to control magnetic poles of the radial magnetic bearing in real time, thereby performing the dynamic balance correction on the cantilever rotating device 20 until reaching a required dynamic balance state.

In addition, the dynamic balance correction device 30 of the disclosure could also be, for example, a center-of-mass adjustment structure 36 such as a counterweight (as shown in FIG. 4). Taking the counterweight as an example, the center-of-mass adjustment structure 36 is, for example, fixedly or movably disposed on the cantilever rotating device 20, and is capable of performing the corresponding dynamic balance correction on the cantilever rotating device 20, for example, by pivoting, retracting or moving. For example, the counterweight is fixedly provided on the wafer holder 23 of the holding part 22, and the wafer holder 23 has non-equivalent cross-sectional areas (that is, different thicknesses) along a direction of the axis line 24a of the rotating shaft 24 in order to achieve an effect of the dynamic balance correction. The counterweight could also be, for example, movably disposed on the wafer holder 23 of the holding part 22, and is capable of moving or retracting on the wafer holder 23 along a direction of the axis line 24a of the rotating shaft 24 to achieve an effect of the dynamic balance correction. Alternatively, the counterweight is, for example, pivotally disposed on the wafer holder 23 of the holding part 22 and is capable of rotating on the wafer holder 23 to achieve an effect of the dynamic balance correction through eccentricity. Since a person having ordinary skill in the art to which the disclosure pertains, based on the foregoing disclosure of the disclosure, should understand how to achieve the aforementioned dynamic balance correction efficacies through the counterweight and the required matching structures and auxiliary components, therefore no further details are provided herein.

The cleaning device 40 of the disclosure has the at least one dynamic nozzle unit 42. The dynamic nozzle unit 42 is capable of, for example, automatically and/or manually adjusting at least one operating parameter correspondingly according to at least one specification parameter of the wafer 80 to eject the cleaning fluid to perform the cleaning procedure on the wafer 80 when the cantilever rotating device 20 rotates the wafer 80. For example, the dynamic nozzle unit 42 ejects the cleaning fluid to perform the cleaning procedure on the wafer 80 in a scanning (or reciprocating) manner when the cantilever rotating device 20 rotates the wafer 80, thereby reducing a usage amount of the cleaning fluid required for the cleaning procedure. Since a person having ordinary skill in the art to which the disclosure pertains, based on the foregoing disclosure of the disclosure, should understand how the dynamic nozzle unit 42 achieves the above-mentioned efficacies and the required matching structures and auxiliary components, therefore no further details are provided herein. The specification parameter of the wafer 80 is selected from a group consisting of quantity, weight, position and size. The operating parameter of the dynamic nozzle unit 42 is selected from a group consisting of an ejection direction of the dynamic nozzle unit 42, a quantity of the dynamic nozzle unit 42, a flow rate of the cleaning fluid, a reciprocating speed of the dynamic nozzle unit 42 and a cleaning time. A quantity of the dynamic nozzle unit 42 is, for example, more than one, and the dynamic nozzle units 42 are, for example, spaced apart from each other by a certain distance. The dynamic nozzle units 42 could optionally operate independently, and the dynamic nozzle units 42 could also optionally operate cooperatively with each other to jointly clean the wafer 80. Wherein the dynamic nozzle units 42 operate cooperatively with each other, for example, by performing the cleaning procedure simultaneously, sequentially or alternatively in a same or a complementary cleaning mode on the wafer 80 or the wafer 80 to be cleaned, thereby improving a cleaning effect and saving a usage amount of the cleaning fluid. A type of the cleaning fluid corresponds to the wafer 80 to be cleaned and is not limited to liquid and/or gas. Taking cleaning the wafer 80 with a photoresist component as an example, the cleaning fluid ejected by the dynamic nozzle unit 42 is, for example, a cleaning liquid (such as deionized water or ozone water of aqueous solution) and/or hot steam (such as vaporized water), or could also be any suitable photoresist cleaning fluid, and could even be a corresponding cleaning fluid according to substances to be cleaned or removed. The disclosure is capable of achieving better cleaning effects and improving residual phenomena of the cleaning fluid, especially for the wafer 80 of a component stack structure with a high aspect ratio that is traditionally difficult to clean and prone to residual phenomena. In addition, a person having ordinary skill in the art to which the disclosure pertains should understand that an operation mode of the dynamic nozzle unit 42 of the disclosure is not limited to the above content, any operation mode could be applicable to the disclosure as long as an effect of cleaning the wafer 80 could be achieved.

For example, the wafer processing system 100 of the disclosure further optionally comprises a microwave generating unit 44. The microwave generating unit 44 generates a microwave to quickly and immediately heat part or all of the cleaning liquid (such as water or ozone water) provided by the fluid supply tank 43 into hot steam, and eject the hot steam through the dynamic nozzle unit 42 to the wafer 80. As mentioned above, the wafer processing system 100 of the disclosure, for example, further optionally comprises an auxiliary gas supply source 46 for supplying an auxiliary gas to the processing tank 10 when performing the cleaning procedure and/or the drying procedure. Wherein the auxiliary gas supply source 46 is not limited to sharing the dynamic nozzle unit 42 that ejects the cleaning fluid to supply the auxiliary gas to the processing tank 10. The auxiliary gas supply source 46, for example, could also supply the auxiliary gas to the processing tank 10 through the independent dynamic nozzle unit 42, or supply the auxiliary gas to the processing tank 10 through a general gas input port 17. As long as the auxiliary gas could be supplied to the processing tank 10, it could be applicable to the disclosure. The auxiliary gas supply source 46 of the disclosure comprises, for example, an ozone supply source 46a and/or a hot nitrogen supply source 46b. Similarly, the disclosure is not limited to the above examples, any suitable method that is capable of providing the hot steam and the auxiliary gas could be applicable to the disclosure.

Taking the cleaning procedure as an example, if the wafer 80 to be cleaned has a photoresist component needed to be cleaned, the cleaning fluid ejected by the dynamic nozzle unit 42 is, for example, an aqueous solution and/or hot steam, and the auxiliary gas supply source 46 uses the ozone supply source 46a to supply the auxiliary gas such as ozone (O3), so that the cleaning fluid reacts with the auxiliary gas to instantly form ozone water, thereby cleaning the wafer 80. When the aqueous solution and/or hot steam are/is ejected onto the rotating (such as high-speed tilt rotation) wafer 80, they will first hit the auxiliary gas (ozone gas) provided by the auxiliary gas supply source 46 at high speed to form ozone water capable of removing the photoresist (i.e., vapor ozone stripping (VOS) technology), and then immediately contact the rotating wafer 80, thereby reducing a thickness of an interface diffusion layer between the ozone water and the photoresist, and accelerating a diffusion rate of the ozone water on the photoresist. Moreover, the disclosure is capable of greatly increasing a solubility of ozone by using a high pressure when water and/or hot steam hits the ozone gas at high speed, thus capable of greatly improving a low efficiency of the conventional immersion photoresist removal technology. The disclosure is capable of effectively increasing a concentration of ozone water, and also capable of preventing the ozone water from reducing its concentration due to poor half-life or solubility during the cleaning procedure of the wafer 80. In addition, the disclosure is not limited thereto. The disclosure could also, for example, use the dynamic nozzle unit 42 to directly inject ozone water or ozone gas into the processing tank 10, or provide ozone gas in any other suitable manner (such as through the gas input port 17) to the processing tank 10. Taking the drying procedure as an example, the auxiliary gas supply source 46, for example, supplies the auxiliary gas such as hot nitrogen ($N_2$) to the processing tank 10 through the hot nitrogen supply source 46b to assist in drying the wafer 80. It could be known that the disclosure is capable of shortening a time required for the overall cleaning procedure or drying procedure by supplying the auxiliary gas such as ozone or hot nitrogen.

The drying device 60 of the disclosure is used to perform the drying procedure on the wafer 80 that has been processed by the cleaning procedure when the cantilever rotating device 20 rotates the wafer 80. For example, the drying device 60 optionally comprises a thermal energy supply unit 62 and/or an air extraction unit 64. The thermal energy supply unit 62 is used to supply thermal energy to the processing tank 10 during the drying procedure, which helps to accelerate volatilization of the cleaning liquid in the cleaning fluid, so as to accelerate drying of the wafer 80. Wherein the thermal energy supply unit 62 is, for example, an infrared light (IR) generating source capable of generating infrared rays, but is not limited thereto. The infrared light generating source is capable of providing thermal energy to the processing tank 10 by emitting infrared rays. In addition, if a wavelength of infrared rays resonates with components of the cleaning fluid to increase a temperature, the drying procedure could also be accelerated. That is, the disclosure could not only rotate and throw off the cleaning fluid on the wafer 80 through the cantilever rotating device 20, but could also use thermal energy or reduce gas pressure to accelerate drying of the wafer 80. Similarly, the disclosure could also optionally use the thermal energy supply unit 62 (such as the infrared light generating source) of the drying device 60 to provide thermal energy to the processing tank 10 during the cleaning procedure to accelerate the cleaning procedure. The disclosure could also optionally use the gas input port 17 to output the hot nitrogen supplied by the hot nitrogen supply source 46b or use the dynamic nozzle unit 42 to eject the hot nitrogen supplied by the hot nitrogen supply source 46b when performing the drying procedure, that is, by continuously introducing and discharging hot nitrogen gas, the disclosure is capable of causing the cleaning fluid to leave a surface of the wafer 80 and to discharge to outside of the processing tank 10, thereby achieving an effect of drying the wafer 80. In addition, hot nitrogen also helps to accelerate decomposition of ozone or ozone water used in the cleaning procedure into oxygen and water, thus capable of achieving an effect of clean emissions.

The air extraction unit 64 of the drying device 60 of the disclosure is, for example, an air extraction pump, and is communicated to the processing tank 10 through the output pipe fitting 19, such as an output pipe 19d and a control valve 19c. However, a way in which the air extraction unit 64 being communicated to the processing tank 10 is not limited to the above example. As long as a gas pressure of the processing tank 10 could be reduced, any method could be applicable to the disclosure. During the drying procedure, the disclosure uses the air extraction unit 64 to extract gas from the processing tank 10 to reduce a gas pressure of the processing tank 10 to lower than an atmospheric pressure (760 torr), which helps to accelerate volatilization of the cleaning liquid in the cleaning fluid in order to achieve an effect of accelerating drying. Moreover, for the wafer 80 of a component stack structure with a high aspect ratio that is traditionally difficult to dry, the drying device 60 of the disclosure is capable of further shortening a time required for the overall drying procedure. There is no limit to a degree of vacuum required to be provided by the air extraction unit 64 of the disclosure, a degree of vacuum could range from low vacuum to ultra-high vacuum. As long as it helps to accelerate drying of the wafer 80, any vacuum degree could be applicable to the disclosure.

Based on the above, the wafer processing system according to the disclosure has one advantage and one technical efficacy or more than one advantage and more than one technical efficacy:

(1) The cantilever rotating device is capable of rotating the wafer at a required speed, and is capable of saving components and making an interior of the processing tank simpler.

(2) The cantilever rotating device rotates the wafer obliquely to increase an efficiency of cleaning and drying the wafer. A tilted interceptor plate helps to discharge the cleaning fluid and prevents the cleaning fluid from accumulating in the processing tank.

(3) The dynamic balance correction device is capable of maintaining the dynamic balance state of the cantilever rotating device when holding the wafer with a variety of specification parameters during rotation.

(4) The dynamic nozzle unit is capable of adjusting operating parameter according to the specification parameters of the wafer during the cleaning procedure, and is capable of saving a usage amount of the cleaning fluid and achieving cleaning effects faster.

(5) An auxiliary gas supplied by an auxiliary gas supply source could be used to assist in cleaning the wafer and could also be used to assist in drying the wafer.

(6) The drying device has a thermal energy supply unit capable of increasing a temperature in the processing tank, and an air extraction unit capable of reducing an air pressure in the processing tank to accelerate drying of the wafer.

(7) An anti-vibration foot made of rigid materials is capable of effectively reducing a vibration value.

(8) The use of vapor ozone stripping (VOS) technology helps to improve an effect of cleaning and removing photoresist, and is capable of significantly reducing any impact on the environment, health and safety.

Note that the specification relating to the above embodiments should be construed as exemplary rather than as limitative of the present disclosure, with many variations and modifications being readily attainable by a person of average skill in the art without departing from the spirit or scope thereof as defined by the appended claims and their legal equivalents.

What is claimed is:

1. A wafer processing system at least comprising:
at least one processing tank having a cantilever rotating device and a dynamic balance correction device, the cantilever rotating device having a holding part for holding a wafer of a variety of specification parameters and causing the wafer to rotate along a rotating shaft of the cantilever rotating device, wherein the dynamic balance correction device performs a corresponding dynamic balance correction on the cantilever rotating device, so that the cantilever rotating device is in a dynamic balance state during rotation;
a cleaning device having at least one dynamic nozzle unit, the dynamic nozzle unit correspondingly adjusting at least one operating parameter according to the specification parameters of the wafer, and ejecting a cleaning fluid to the wafer to perform a cleaning procedure when the cantilever rotating device rotates; and
a drying device used to perform a drying procedure on the wafer processed by the cleaning procedure when the cantilever rotating device rotates.

2. The wafer processing system as claimed in claim 1, wherein the rotating shaft of the cantilever rotating device rotates obliquely at an angle that is not parallel to a horizontal plane.

3. The wafer processing system as claimed in claim 1, wherein the processing tank is disposed on a platform through at least one anti-vibration foot so that at least one vibration value of the processing tank is smaller than a preset value.

4. The wafer processing system as claimed in claim 1, wherein in the dynamic balance state, when the cantilever rotating device rotates, an axis line of the rotating shaft coincides with a center line of mass of the cantilever rotating device holding the wafer.

5. The wafer processing system as claimed in claim 1, wherein the processing tank has a shield surrounding the cantilever rotating device.

6. The wafer processing system as claimed in claim 5, wherein an inner side of the shield has an interceptor plate, an interceptor opening of the interceptor plate faces a tangential direction of the wafer during rotation to intercept the cleaning fluid that has completed the cleaning procedure for the rotating wafer.

7. The wafer processing system as claimed in claim 1, wherein the dynamic balance correction device is disposed on the holding part and/or the rotating shaft of the cantilever rotating device for utilizing an over-distance force effect to perform the corresponding dynamic balance correction on the cantilever rotating device so that the dynamic balance state can be maintained when the cantilever rotating device rotates.

8. The wafer processing system as claimed in claim 7, wherein the dynamic balance correction device is an active magnetic bearing for performing the corresponding dynamic balance correction on the cantilever rotating device.

9. The wafer processing system as claimed in claim 7, wherein the dynamic balance correction device comprises at least one first magnetic element and at least one second magnetic element, the first magnetic element is circularly disposed on the cantilever rotating device, the second magnetic element surrounds the cantilever rotating device in a non-contact manner, thereby utilizing the over-distance force effect between the first magnetic element and the second magnetic element to perform the corresponding dynamic balance correction on the cantilever rotating device.

10. The wafer processing system as claimed in claim 1, wherein the dynamic balance correction device is a center-of-mass adjustment structure provided on the cantilever rotating device for correcting a degree of overlap between a center line of mass of the cantilever rotating device holding the wafer and an axis line of the rotating shaft.

11. The wafer processing system as claimed in claim 10, wherein center-of-mass adjustment structure performs the corresponding dynamic balance correction on the cantilever rotating device by pivoting, retracting or moving.

12. The wafer processing system as claimed in claim 1, wherein the dynamic balance correction device is at least one wafer holder of the holding part of the cantilever rotating device, and the wafer holder has non-equivalent cross-sectional areas along a direction of an axis line of the rotating shaft.

13. The wafer processing system as claimed in claim 1, wherein the cleaning fluid is cleaning liquid and/or hot steam.

14. The wafer processing system as claimed in claim 13, further comprising a microwave generating unit, the microwave generating unit generating a microwave to heat part or all of the cleaning liquid into the hot steam.

15. The wafer processing system as claimed in claim 1, further comprising at least one auxiliary gas supply source for supplying at least one auxiliary gas to the processing tank.

16. The wafer processing system as claimed in claim 15, wherein the cleaning fluid comprises aqueous solution and/or hot steam, and the auxiliary gas is ozone, so that the cleaning fluid reacts with the auxiliary gas to form an ozone aqueous solution to clean the wafer.

17. The wafer processing system as claimed in claim 15, wherein the auxiliary gas is hot nitrogen to assist in drying the wafer.

18. The wafer processing system as claimed in claim 15, wherein the drying device comprises a thermal energy supply unit and/or an air extraction unit, the thermal energy supply unit supplies a thermal energy to the processing tank during the drying procedure, and the air extraction unit makes the processing tank lower than an atmospheric pressure during the drying procedure, thereby accelerating drying of the wafer.

19. The wafer processing system as claimed in claim 1, wherein the specification parameters of the wafer are selected from a group consisting of quantity, weight, position and size, and the operating parameter of the dynamic nozzle unit is selected from a group consisting of an ejection direction of the dynamic nozzle unit, a quantity of the dynamic nozzle unit, a flow rate of the cleaning fluid, a reciprocating speed of the dynamic nozzle unit and a cleaning time.

20. The wafer processing system as claimed in claim 1, wherein a quantity of the dynamic nozzle unit is more than one, and the dynamic nozzle units operate cooperatively with each other to jointly clean the wafer.

21. The wafer processing system as claimed in claim 1, wherein the dynamic nozzle unit ejects the cleaning fluid on the wafer in a scanning manner to clean the wafer.

22. The wafer processing system as claimed in claim 1, wherein one side of the cantilever rotating device is a supporting end, another side of the cantilever rotating device is a free end, and the wafer is detachably placed on the holding part of the cantilever rotating device through the free end.

23. The wafer processing system as claimed in claim 1, wherein the dynamic balance correction device performs the corresponding dynamic balance correction on the cantilever rotating device based on the specification parameters of the wafer, the operating parameter of the dynamic nozzle unit, a rotation speed of the rotating shaft and/or a vibration state.

* * * * *